United States Patent
Routledge

(10) Patent No.: US 10,910,938 B2
(45) Date of Patent: *Feb. 2, 2021

(54) CURRENT IN-RUSH LIMITER

(71) Applicant: pSemi Corporation, San Diego, CA (US)

(72) Inventor: Antony Christopher Routledge, Basingstoke (GB)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/790,493

(22) Filed: Feb. 13, 2020

(65) Prior Publication Data

US 2020/0266696 A1 Aug. 20, 2020

Related U.S. Application Data

(63) Continuation of application No. 16/277,779, filed on Feb. 15, 2019, now Pat. No. 10,594,202.

(51) Int. Cl.
*H02M 1/08* (2006.01)
*H02M 3/07* (2006.01)
*H03K 17/16* (2006.01)

(52) U.S. Cl.
CPC ............ *H02M 1/08* (2013.01); *H02M 3/07* (2013.01); *H03K 17/162* (2013.01)

(58) Field of Classification Search
CPC ......... H02M 1/08; H02M 3/07; H03K 17/162
USPC ................................ 327/518, 519, 520, 551
See application file for complete search history.

(56) References Cited

U.S. PATENT DOCUMENTS

| | | | |
|---|---|---|---|
| 8,743,553 | B2 | 6/2014 | Giuliano |
| 9,041,459 | B2 | 5/2015 | Szczeszynski et al. |
| 9,497,854 | B2 | 11/2016 | Giuliano |
| 9,882,471 | B2 | 1/2018 | Giuliano |
| 10,263,514 | B1 | 4/2019 | Aboueldahab |

(Continued)

OTHER PUBLICATIONS

Caro, et al., "Novel DC-DC Multilevel Boost Converter", ResearchGate, Conference Paper, IEEE Annual Power Electronics Specialists Conference, Jul. 2008, pp. 2146-2151 (7 pgs.).

(Continued)

*Primary Examiner* — William Hernandez
(74) *Attorney, Agent, or Firm* — Jaquez Land Greenhaus LLP; John Land, Esq.

(57) ABSTRACT

Circuits and methods for limiting excessive current in circuits (such as step-up DC-to-DC converter circuits) in which very low ohmic FETs (VLOFETs) are used in circuit pathways that are subjected to startup in-rush current. Embodiments include a current mirror driver circuit that can be coupled to the gates of a VLOFET to form a current mirror that limits current flow through the VLOFET. The current mirror driver circuit provides for pulsed operation so that a coupled VLOFET still toggles between an OFF state and a current limited mode, particularly during a startup period. By using the current mirror driver circuit in conjunction with VLOFETs in circuit pathways that are subjected to startup in-rush current, in-rush current can be regulated to an acceptable level. Notably, no additional impedances are required in circuit pathways that are subjected to startup in-rush current to limit in-rush current, thus avoiding loss of efficiency.

20 Claims, 10 Drawing Sheets

(56) References Cited

U.S. PATENT DOCUMENTS

| | | |
|---|---|---|
| 10,594,202 B1 | 3/2020 | Routledge |
| 2009/0058378 A1 | 3/2009 | Chee |
| 2013/0249513 A1 | 9/2013 | Kujala |
| 2013/0265807 A1 | 10/2013 | Lee |
| 2015/0061622 A1 | 3/2015 | Bhattad |
| 2018/0013294 A1 | 1/2018 | Edelson |
| 2018/0026531 A1* | 1/2018 | Nagda .................. H02M 3/156 327/109 |
| 2019/0214973 A1* | 7/2019 | Choi ....................... H02M 3/26 |

OTHER PUBLICATIONS

Butti, et al., "Novel High Efficiency Multilevel DC-DC Boost Converter Topologies and Modulation Strategies", Laboratory for High Power Electronic Systems, Proceedings of the 2011 14th European Conference on Power Electronics and Applications, 11 pgs.
Hernandez, William, Office Action received from the USPTO dated Jul. 30, 2019 for U.S. Appl. No. 16/277,779, 7 pgs.
Hernandez, William, Notice of Allowance received from the USPTO dated Nov. 5, 2019 for U.S. Appl. No. 16/277,779, 8 pgs.
PSemi Corporation, Response filed in the USPTO dated Oct. 22, 2019 for U.S. Appl. No. 16/277,779, 8 pgs.
PSemi Corporation, Preliminary Amendment filed in the USPTO dated Mar. 19, 2019 for U.S. Appl. No. 16/277,779, 7 pgs.

* cited by examiner

*800*

```
┌─────────────────────────────────────┐
│ In a very low ohmic FET having a control gate
│ configured to be coupled to or couplable to a
│ source of a clock phase, coupling a current      ─── 802
│ mirror driver circuit to the control gate of the
│ VLOFET and to the source of the clock phase
└─────────────────────────────────────┘
                    │
                    ▼
┌─────────────────────────────────────┐
│ Selectively applying to the control gate of the
│ VLOFET either the clock phase limited to a first
│ voltage range by the current mirror driver
│ circuit, or the clock phase limited to a second,
│ wider voltage range, wherein the current mirror  ─── 804
│ driver circuit and VLOFET, when coupled,
│ comprise a current mirror that limits current flow
│ through the VLOFET when the clock phase is
│ limited to the first voltage range
└─────────────────────────────────────┘
```

> In a very low ohmic FET having a control gate configured to be coupled to or couplable to an associated source of a clock phase and connected in a circuit pathway that is subjected to startup in-rush current, coupling the control gate of at least one VLOFET to a corresponding current mirror driver circuit configured to be coupled to a general circuit supply voltage and to the associated source of the clock phase — 902

> Coupling the current mirror driver circuit to a switch configured to selectively apply to the control gate of the at least one VLOFET either the clock phase limited to a first voltage range by the current mirror driver circuit, or the clock phase limited to a second, wider voltage range, wherein the at least one VLOFET and the corresponding current mirror driver circuit, when coupled, comprise a current mirror that limits in-rush current flow through the at least one VLOFET when the clock phase is limited to the first voltage range — 904

FIG. 9

CURRENT IN-RUSH LIMITER

CROSS-REFERENCE TO RELATED APPLICATIONS—CLAIM OF PRIORITY

This application is a continuation of, and claims the benefit of priority under 35 USC § 120 of, commonly assigned and co-pending prior U.S. application Ser. No. 16/277,779, filed Feb. 15, 2019, entitled "Current In-Rush Limiter", now U.S. Pat. No. 10,594,202, issued on Mar. 17, 2020, the disclosure of which is incorporated herein by reference in its entirety.

BACKGROUND

(1) Technical Field

This invention relates to electronic circuits, and more particularly to current in-rush limiter circuits and DC-DC converters.

(2) Background

Many electronic products, particularly battery-operated mobile computing and/or communication products (e.g., notebook computers, ultra-book computers, and tablet devices), require multiple voltage levels. For example, radio transmitter power amplifiers may require relatively high voltages (e.g., 12V or more), whereas logic circuitry may require a fairly low voltage level (e.g., 1-2V). Still other circuitry may require an intermediate voltage level (e.g., 2.5, 3.3, or 5V).

It is common to use DC-to-DC converters to generate a lower or higher DC voltage from a DC power source. DC-to-DC converters which generate a lower voltage level from a higher voltage DC power source are commonly known as step-down or buck converters, so-called because $V_{OUT}$ is less than $V_{IN}$, and hence the converter is "bucking" the input voltage. DC-to-DC converters which generate higher voltage levels than a DC power source are commonly known as step-up or boost converters, because $V_{OUT}$ is greater than $V_{IN}$.

Many options exist to create buck and/or boost converters, including inductive, capacitive, and/or linear regulator (including Low Drop Out—LDO—regulators) circuits, with size and efficiency being an important differentiator among them. For example, various configurations of DC-to-DC converters (including Ladder, Dickson, Series-Parallel, Fibonacci, and Doubler configurations) rely on alternating configurations of switch elements to propagate charge and transfer energy between the terminals of the converter. Energy losses associated with charge propagation determine the efficiency of the converter.

Some step-down DC-to-DC converters have been made very efficient, reaching up to 95-98% efficiency by optimizing various circuit elements and circuit configurations. One circuit element that has contributed to such high efficiencies is a very low ohmic (VLO) switch, which is generally a field effect transistor (FET) switch complex having an overall ON resistance $R_{ON}$ of less than 10 milliohms, down to as little as 1 milliohm (or even less in some cases). To achieve such low $R_{ON}$ values, the VLO FET switch complex (or "VLOFET") generally includes hundreds to thousands of FETs coupled in parallel but switched as a single unit. The large number of devices creates an effective total gate width that is quite large, and the ON resistance is inversely proportional to the gate width.

Because of their low $R_{ON}$ resistance, VLOFETs provide little impedance to high current flows. In many step-down DC-to-DC converters, this characteristic generally does not pose a significant problem with respect to high startup inrush current, because the converter configuration and other circuit components serve to limit startup inrush current. However, in a number of step-up DC-to-DC converter circuits, use of VLOFETs would be problematic, because the converter configuration and other components do not limit startup inrush current. Consequently, the startup inrush current may reach magnitudes that damage or destroy the VLOFETs and/or other circuit elements, including a connected power supply (e.g., a battery and related circuitry).

For example, FIG. 1 is a schematic diagram of a prior art step-up DC-to-DC converter circuit 100. The illustrated circuit comprises one section or cell of a Dickson multiply-by-3 boost DC-to-DC converter; generally, a second similar section or cell (not shown) having complimentary clock phasing for corresponding switches S1-S7 would be coupled to a node 102 of a shared output storage capacitor $C_S$.

In the illustrated example, the circuit 100 includes 3 series-connected switches S1, S2, S3 coupled in series to a first parallel branch comprising 2 series-connected switches S4, S6, and to a second parallel branch comprising 2 series-connected switches S5, S7. Each switch may comprise, for example, one or more FETs, including one or more MOSFETs; in FIG. 1, both NFETs (switches S3-S7) and PFETs (switch S1) are used. Each switch is coupled to one of two complementary clock phases, P1 or P2, as indicated parenthetically for each switch S1-S7. Each FET switch S1-S7 is shown schematically as including a corresponding parasitic diode D1-D7 between the body and the drain of the FET (in this application, "clock phase" refers to a clock signal, such as phase P1 or P2, and not to high or low excursions of a single clock signal).

Coupled between a first upper pair of alternating phase switches S1(P1) and S2(P2) and a first branch pair of alternating phase switches S4(P1) and S6(P2) is a first capacitor C1. Coupled between a second upper pair of alternating phase switches S2(P2) and S3(P1) and a second branch pair of alternating phase switches S5(P2) and S7(P1) is a second capacitor C2. In one embodiment, the capacitors have the same value, about 10 microfarads. An input voltage $V_{IN}$, to be boosted by a factor of 3 at node 102, is coupled through a relatively small inductor L (e.g., about 10 nH), the output of which is a voltage Vx, coupled as shown between the 3 series-connected switches S1-S3 and the first and second parallel branches of 2 series-connected switches S4, S6, and S5, S7. The inductor L limits current flow into the DC-to-DC converter circuit 100 after the capacitors C1 and C2 charge during a startup period.

In the illustrated configuration, after the startup period, the step-up DC-to-DC converter circuit 100 operates in an adiabatic mode in which variations in current from transferring charge between the capacitors C1 and C2 during the alternating phases of operation is limited by inclusion of a non-capacitive element, such as one or more inductors and/or magnetic elements. The switches S1-S7 and support circuitry (such as clock phase generation circuitry, not shown), shown as bounded by dashed box 104, may be fabricated as "on-chip" components of an integrated circuit (IC). The capacitors C1, C2 may be fabricated on-chip as well, but it is common to use off-chip capacitors (as shown in FIG. 1). Further details of configurations for, and operation of, Dickson converters in particular may be found, for example, in U.S. patent application Ser. No. 15/920,327, filed Mar. 13, 2018, entitled "Selectable Conversion Ratio DC-DC Converter". Further information regarding adiabatic DC-to-DC conversion circuits may be found, for example, in U.S. Pat. No. 9,041,459, issued May 25, 2015, entitled "Partial Adiabatic Conversion", and in U.S. Pat. No. 9,882,471, issued Jan. 30, 2018, entitled "DC-DC Converter with Modular Stages".

The step-up DC-to-DC converter circuit 100 shown in FIG. 1 can operate well if VLOFETs are not used in circuit pathways that are subjected to startup in-rush current, because sufficient circuit path (including conventional FETs) resistance exists to limit current flow. However, such circuits would have lower efficiency due to such circuit path resistance. Attempting to use low resistance VLOFETs in place of conventional FETs to increase efficiency causes a problem: if VLOFETs are used in circuit pathways that are subjected to startup in-rush current, VLOFETs present essentially no resistance to current flow.

For example, in the step-up DC-to-DC converter circuit 100 shown in FIG. 1, startup in-rush current occurs during a relatively short time period at circuit startup while the capacitors C1 and C2 are charging. Once the circuit is running, the capacitors C1 and C2 are pre-charged on each clock cycle and the in-rush current ceases, and accordingly an operational state or equilibrium is achieved. When a voltage is applied at $V_{IN}$ and clocking first begins, switch S7 is turned ON during clock phase P1, allowing current to flow through the body-drain diodes D3, D7 of FET switches S3, S7 in a current path from $V_{IN}$ to ground (switch S3 does not turn ON, as there is no voltage high enough to do so, but diode D3 conducts current). The body-drain diodes D1-D7 switch charge in the circuit 100 until there is sufficient voltage to start normal controlled switching through the FETs. Thus, the diodes D1-D7 start the charge pumping operation, but as the voltages build up, the switches S1-S7 start to take over. The diodes have a voltage drop of around 0.7V, so they will reduce efficiency until the switches are fully active, which occurs when the circuit 100 has settled and the desired output voltage has been achieved.

Utilizing VLOFETs for the switches S1-S7 would result in very significant in-rush current flows from $V_{IN}$ to ground. More specifically, during clock phase P1, with switch S7 ON and diode D3 conducting current, the bottom plate of capacitor C2 is effectively at ground through VLOFET switch S7, and VLOFET switch S3 allows essentially unlimited and unregulated current to flow onto the top plate of capacitor C2 via diode D3. A similar problem occurs with switches S1 and S6, but with somewhat lower startup in-rush current flow. For example, during startup, switch S6 will be an ON and diodes D3 and D2 will allow charge to flow onto capacitor C1.

FIG. 2 shows a graph 200 of the startup in-rush current through the inductor L as a function of time in one modeled circuit of the type shown in FIG. 1 using VLOFETs for all switches. The in-rush current reached 160 amps within a few microseconds before decreasing to a few 10's of milliamps at about 80 µS, when the output is settled before a load is presented. In this example, a load is presented at about 100 µS, at which point the operational current increases to about 9 amps. As an illustration of the consequences of such a high in-rush current, in a battery-powered circuit, drawing 160 amps for even a few microseconds can cause damage to the battery as well as to other circuitry in the current flow path (including the step-up DC-to-DC converter circuit 100). This startup in-rush high current problem when using VLOFETs occurs not only in step-up DC-to-DC converter circuits like the one shown in FIG. 1, but in other types of step-up DC-to-DC converter circuits in which VLOFETs are used in circuit pathways that are subjected to startup in-rush current. More generally, high startup in-rush current may occur in many types of circuits that use VLOFETs in startup current flow paths.

Such startup in-rush current can be limited by making the inductor L large (thus limiting the rate of change of current through the inductor) or by using relatively high resistance FETs (e.g., 1-2 ohms) somewhere in the current path (e.g., for switch S7) or by including resistors (e.g., 1-2 ohms) somewhere in the current path (e.g., between switch S7 and ground). However, such approaches reduce the efficiency of the circuit, substantially negating the efficiency benefits sought by using VLOFETs in the first place. For example, a sufficiently large inductor negatively impacts circuit area, height, cost, and performance. Further, process-voltage-temperature (PVT) variations in such components reduce the average efficiency of production lots of such circuits and cause other known problems.

Accordingly, there is a need for circuits and methods for limiting startup in-rush current in circuits (such as step-up DC-to-DC converter circuits) in which VLOFETs are used in circuit pathways that are subjected to startup in-rush current. The present invention meets this need and provides additional benefits.

SUMMARY

The present invention encompasses circuits and methods for limiting startup in-rush current in circuits (such as step-up DC-to-DC converter circuits) in which very low ohmic FETs (VLOFETs) are used in circuit pathways that are subjected to startup in-rush current. Embodiments of the invention include a current mirror driver circuit that can be coupled to the gate of a VLOFET to form a current mirror that limits current flow through the VLOFET. The current mirror driver circuit provides for pulsed operation so that a coupled VLOFET still toggles between an OFF state and a current limited mode during a startup period.

By using the current mirror driver circuit in conjunction with VLOFETs in circuit pathways that are subjected to startup in-rush current, in-rush current can be regulated to an acceptable level. Notably, no additional impedances are required in circuit pathways that are subjected to startup in-rush current to limit in-rush current, thus avoiding loss of efficiency. Embodiments may be implemented with N-type FETs or P-type FETs, or a combination of both (particularly CMOS FETs).

While various embodiments are described in the context of step-up DC-to-DC converter circuits, embodiments of the invention may be used more generally in circuits which use VLOFETs that are subjected to startup in-rush current.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 8 is a process flow chart of a first method for limiting in-rush current through a VLOFET.

FIG. 9 is a process flow diagram of a first method for limiting in-rush current through a step-up DC-to-DC converter circuit having at least one VLOFET.

Like reference numbers and designations in the various drawings indicate like elements.

DETAILED DESCRIPTION

The present invention encompasses circuits and methods for limiting startup in-rush current in circuits (such as step-up DC-to-DC converter circuits) in which very low ohmic FETs (VLOFETs) are used in circuit pathways that are subjected to startup in-rush current. Embodiments of the invention include a current mirror driver circuit that can be coupled to the gate of a VLOFET to form a current mirror that limits current flow through the VLOFET. By using the current mirror driver circuit in conjunction with VLOFETs in circuit pathways that are subjected to startup in-rush current, in-rush current can be regulated to an acceptable level.

Notably, no additional impedances are required in circuit pathways that are subjected to startup in-rush current to limit in-rush current, thus avoiding loss of efficiency. Embodiments may be implemented with N-type FETs or P-type FETs, or a combination of both (including CMOS FETs).

While various embodiments are described below in the context of step-up DC-to-DC converter circuits, embodiments of the invention may be used more generally in circuits which use VLOFETs that are subjected to startup in-rush current.

General Current in-Rush Limiter Circuit

Figure 3:
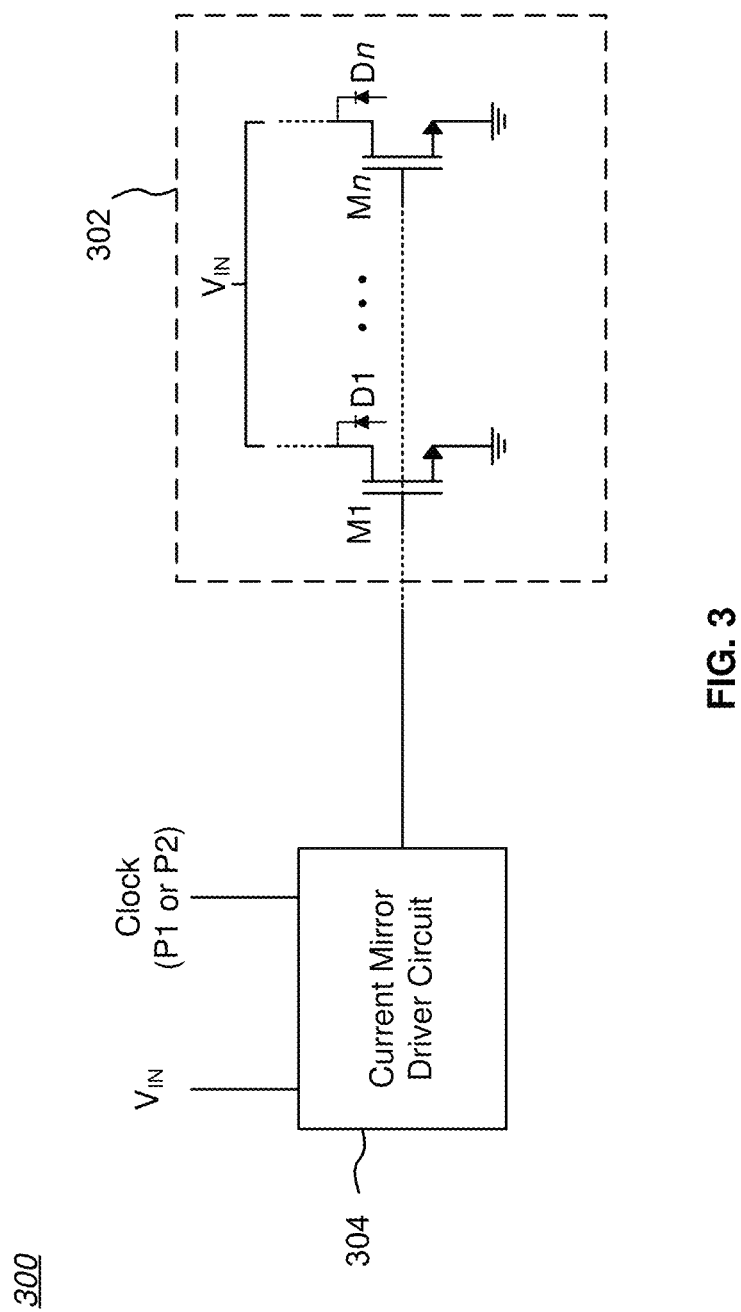
FIG. 3 is a schematic of a current in-rush limited circuit for a step-up DC-to-DC converter circuit (not shown in its entirety) that utilizes VLOFETs as switches.

FIG. 3 is a schematic of a current in-rush limited circuit 300 for a step-up DC-to-DC converter circuit (not shown in its entirety) that utilizes VLOFETs as switches. The step-up DC-to-DC converter circuit may be a capacitor-based charge pump of the type shown in FIG. 1 (i.e., a Dickson step-up DC-to-DC converter circuit, including one having a boost factor of 3), but may also be any step-up DC-to-DC converter circuit utilizing VLOFETs that are subjected to startup in-rush current.

In FIG. 3, a single VLOFET 302 is shown as comprising multiple parallel FETs M1-Mn, all with interconnected gates; accordingly, the FETs M1-Mn switch states as a unit. Thus, the VLOFET 302 behaves like a single FET having a single control gate. Each individual FET M1-Mn includes a corresponding body-drain diode D1-Dn. The number n of individual FETs M1-Mn may number in the hundreds or thousands or more, and is application specific. While N-type FETs are schematically shown, VLOFET 302s comprising P-type FETs may also be used, with suitable changes in the polarity of some circuitry (see also FIG. 4B below). The VLOFET 302 may be, for example, used for switches S1-S7 of the step-up DC-to-DC converter circuit 100 of FIG. 1 to provide high efficiency.

In this example, the gates of FETs M1-Mn are normally connected to one of two complementary clock phases, P1 or P2, for normal post-startup operation. However, during startup of the converter circuit as a whole, the gates of FETs M1-Mn are connected to a current mirror driver circuit 304. The current mirror driver circuit 304 is coupled to a general circuit supply voltage $V_{IN}$ and to a source of one of the two complementary clock phases, P1 or P2, corresponding to a clock phase coupled to the connected VLOFET 302 (not shown). The current mirror driver circuit may also be connected to multiple different FETs used in different locations, provided they have the same source voltage and share the same clock phase.

The combination of the current mirror driver circuit 304 and the VLOFET 302 comprises a current mirror. As is known in the art, a current mirror is a circuit designed to copy a reference current (or a fraction or multiple of the reference current, by ratioing the size of the component devices) through one active device (within the current mirror driver circuit 304) so as to control the current in another active device (the VLOFET 302). The reference current is amplified by the ratio of the number of devices as long as the gate source voltage is the same for the active devices. An important characteristic of a current mirror is that the output current through the controlled current active device is kept essentially constant regardless of loading. Accordingly, by at least temporarily configuring at least some VLOFETs 302 that are in circuit pathways subjected to startup in-rush current as current mirrors, such in-rush current can be regulated to an acceptable level.

Figure 1:
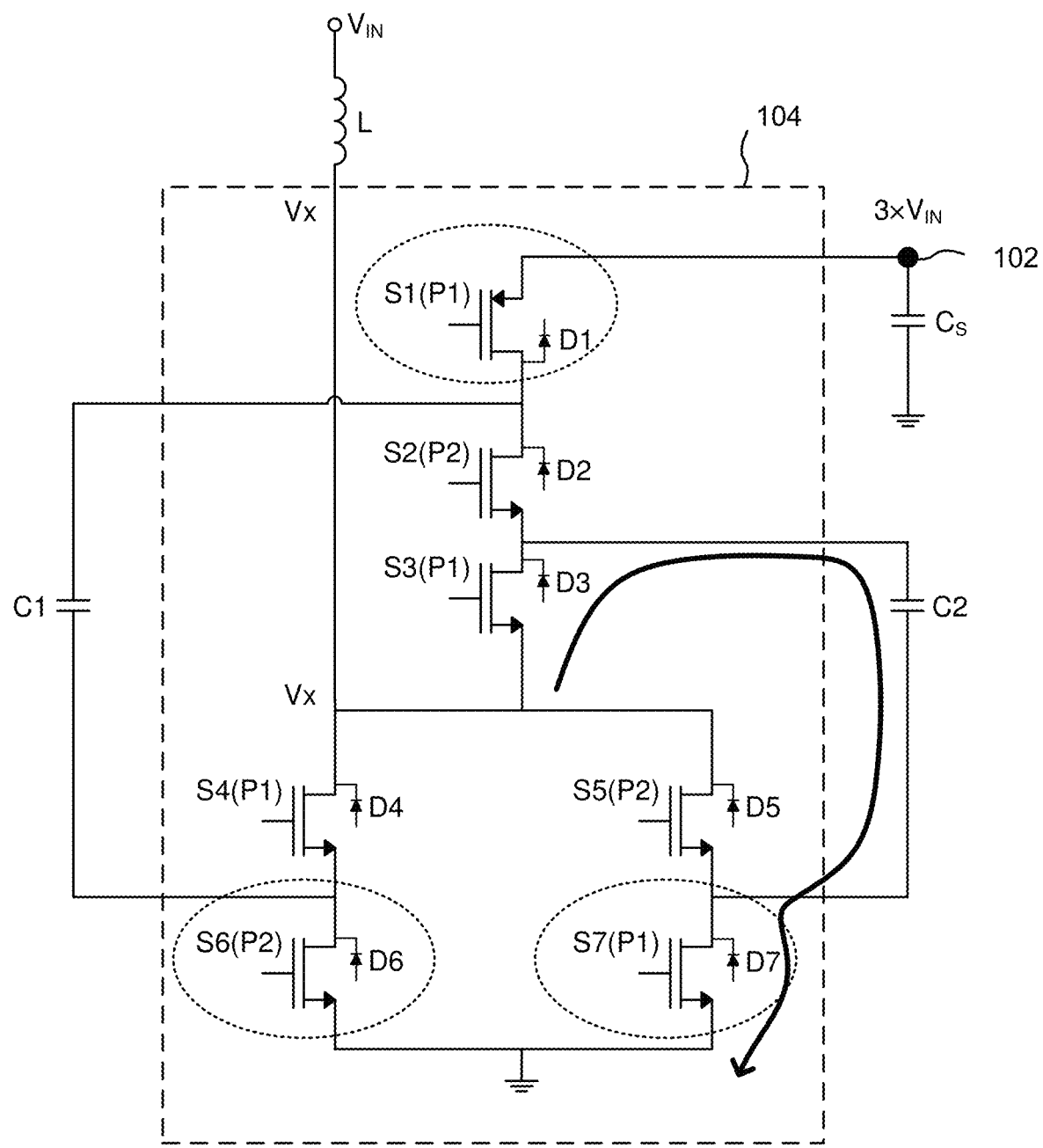
FIG. 1 is a schematic diagram of a prior art step-up DC-to-DC converter circuit.
Figure 2:
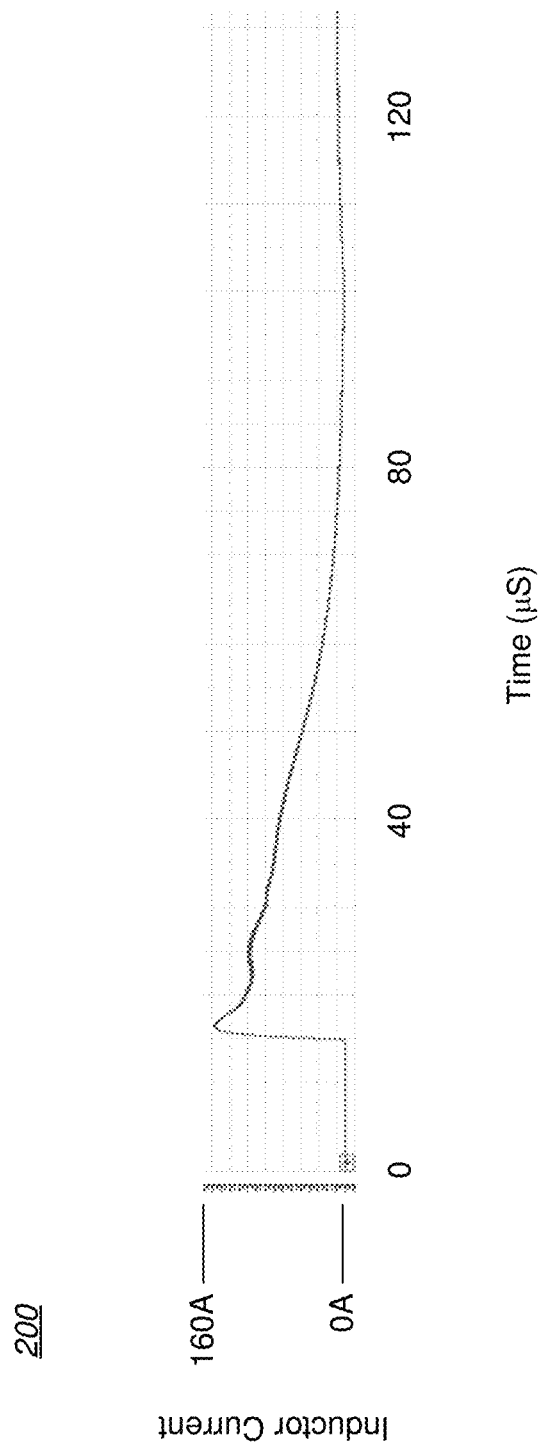
FIG. 2 shows a graph of the startup in-rush current through the inductor L as a function of time in one modeled circuit of the type shown in FIG. 1 using VLOFETs for all switches.

Each VLOFET 302 in a step-up DC-to-DC converter circuit 100 of the type shown in FIG. 1 may be paired with a current mirror driver circuit 304 in some embodiments. Alternatively, current mirror driver circuit 304 may be paired with only those VLOFETs 302 at "edges" of the converter circuit, between the rest of the converter circuit and circuit ground. For example, referring to FIG. 1, only switches S1, S6, and S7 need be paired with a current mirror driver circuit 304 to limit startup in-rush current in the entire converter circuit.

The current mirror driver circuit 304 provides for pulsed operation so that the VLOFET 302 still toggles between an OFF state and a current limited mode during a startup period. Once operational equilibrium is achieved for the step-up DC-to-DC converter circuit as a whole, the current mirror driver circuit 304 may be switched out of circuit and the appropriate clock phase (P1 or P2) may be switched into circuit with the gates of the FETs M1-Mn. Alternatively, the current mirror driver circuit 304 may be reconfigured to provide normal clock phase voltage values to the VLOFET 302 after operational equilibrium is achieved.

The current mirror driver circuit 304 may be implemented in a variety of ways. Following are several embodiments of the current mirror driver circuit 304 that are well-suited for use with VLOFETs 302 in a step-up DC-to-DC converter circuit.

First Embodiment of a Current Mirror Driver Circuit

Figure 4A:
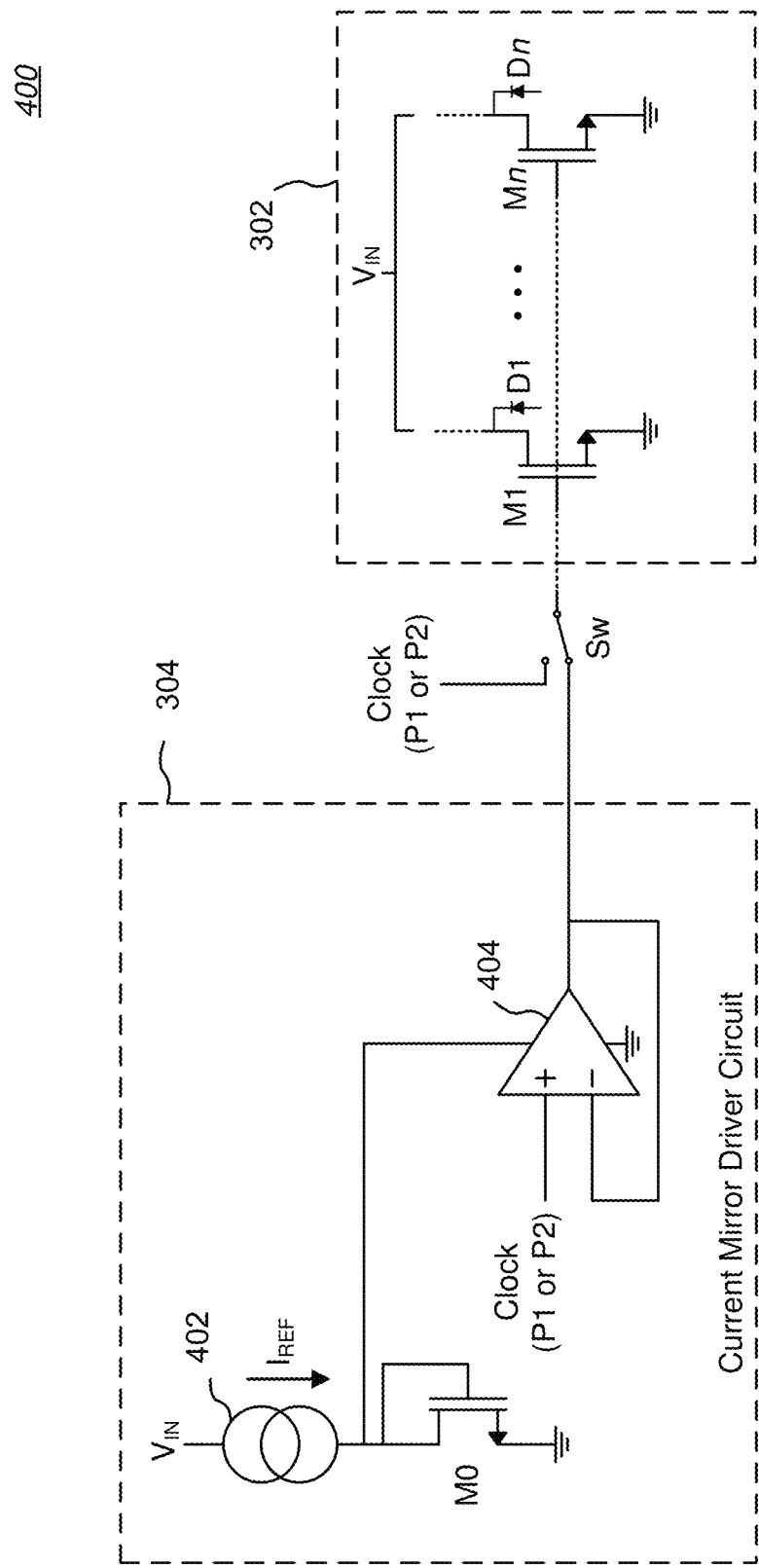
FIG. 4A is a schematic diagram of a current mirror comprising a VLOFET and a first embodiment of a current mirror driver circuit.

FIG. 4A is a schematic diagram of a current mirror 400 comprising a VLOFET 302 and a first embodiment of a current mirror driver circuit 304. The illustrated current mirror driver circuit 304 includes a diode-connected N-type FET M0 having its drain coupled to a current source 402, which in turn is coupled to a source voltage $V_{IN}$. In many embodiments, FET M0 would typically be of the same type and ideally physical parameters (e.g., gate width per finger, gate length, type, etc.) as the FETs M1-Mn in the VLOFET 302 in order to optimize current matching between the devices. A reference current $I_{REF}$ is provided by the current source 402, which is preferably designed to be invariant over PVT variations (which is conventional). In the illustrated embodiment, the gate of FET M0 is coupled as the voltage supply to a differential amplifier 404. The amplifier 404 may be, for example, an operational amplifier (opamp) having a low output impedance.

The output of the amplifier 404 is coupled to an inverting ("−") input terminal of the amplifier 404. A non-inverting ("+") input terminal of the amplifier 404 is coupled to a clock (P1 or P2) matching the clock phase normally provided to the VLOFET 302. In the illustrated example, a single-pole, double-throw (SPDT) switch Sw allows the gates of the FETs M1-Mn of the VLOFET 302 to be coupled either to the output of the amplifier 404 or to the clock phase normally provided to the VLOFET 302. The output of the amplifier 404 should have a high drive strength capable of driving the gates of the large number of individual FETs M1-Mn in the VLOFET 302, since the FET M0 generally cannot drive the n gates of the VLOFET 302 device directly.

The SPDT switch Sw may be implemented using FETs in known manner. While the SPDT switch Sw is shown as external to the current mirror driver circuit 304, it may be included as part of the current mirror driver circuit 304. For example, the switch SW may be positioned at the voltage supply input of the amplifier 404 to switch between $V_{IN}$ or the diode voltage. An alternative would be to tri-state (i.e., set to high impedance) the output of the amplifier 404 and drive FETs M1-Mn with a buffer (not shown) that was tri-stated when the amplifier 404 was in use during the startup current in-rush period. More generally, it is often desirable to place the switch Sw where there is limited current flow. As FETs M1-Mn are relatively large, they require a significant amount of charge to turn OFF and ON. Coupling the switch Sw directly to the gates of FETs M1-Mn means that the switch Sw is in the high current path and hence the switch Sw will itself need to be low resistance. Hence, the switch Sw is preferably placed in a low current point (e.g., positioned at the voltage supply input of the amplifier 404), or two components (e.g., the amplifier 404 and a buffer) may be used that the will drive the gates of FETs M1-Mn, where one of the components is always in a high output impedance OFF state.

In the illustrated example, it is assumed that $V_{IN}$ is about 2.5V to about 5V, that the clock signals P1 and P2 have essentially the same voltage as $V_{IN}$, and that the voltage generated across the diode-connected FET M0 (the "diode voltage") is about 1.2V to about 1.5V; thus, $V_{IN}$ is greater than the diode voltage. As illustrated, the amplifier 404 is configured as a voltage follower, and thus the output of the amplifier 404 is the same as the non-inverting ("+") input terminal. When the clock is at 0V, the amplifier 404 output voltage will drive to ground. When the clock is at P1 or P2 (and thus at about $V_{IN}$), the amplifier 404 tries to drive its output to $V_{IN}$, but as its voltage supply is the diode voltage across FET M0, the amplifier 404 cannot drive its output higher than the diode voltage input supply. Accordingly, the amplifier 404 (and thus the current mirror driver circuit 304) outputs a pulsed voltage that ranges from 0V to the diode voltage of the M0 FET.

As a consequence, the VLOFET 302 is current limited while the current mirror driver circuit 304 is operationally coupled to the FETs M1-Mn (e.g., through the SPDT switch Sw in the configuration illustrated in FIG. 4A), mirroring the reference current $I_{REF}$ through the M0 FET. In the illustrated embodiment, if the FETs M0 and FETs M1-Mn are the same size, and $I_{REF}$=1 mA, and n=10,000, then the VLOFET 302 will be current limited to about 10,000×1 mA, or about 10 amps. After operational equilibrium is achieved, in the illustrated example, the SPDT switch Sw switches to the full-voltage clock input (e.g., P1 or P2) for normal control of the FETs M1-Mn. Accordingly, in terms of function, in the illustrated embodiment, the switch Sw is configured to apply to the gates of FETs M1-Mn either a reduced-range clock signal (P1 or P2) limited to a first voltage range (e.g., from 0V to the diode voltage of the M0 FET), or a full-range clock signal (P1 or P2) having a second, wider voltage range (e.g., from 0V to the about $V_{IN}$). However, other voltage ranges for the reduced-range clock signal and/or the full-range clock signal may be used as appropriate for particular applications.

Figure 4B:
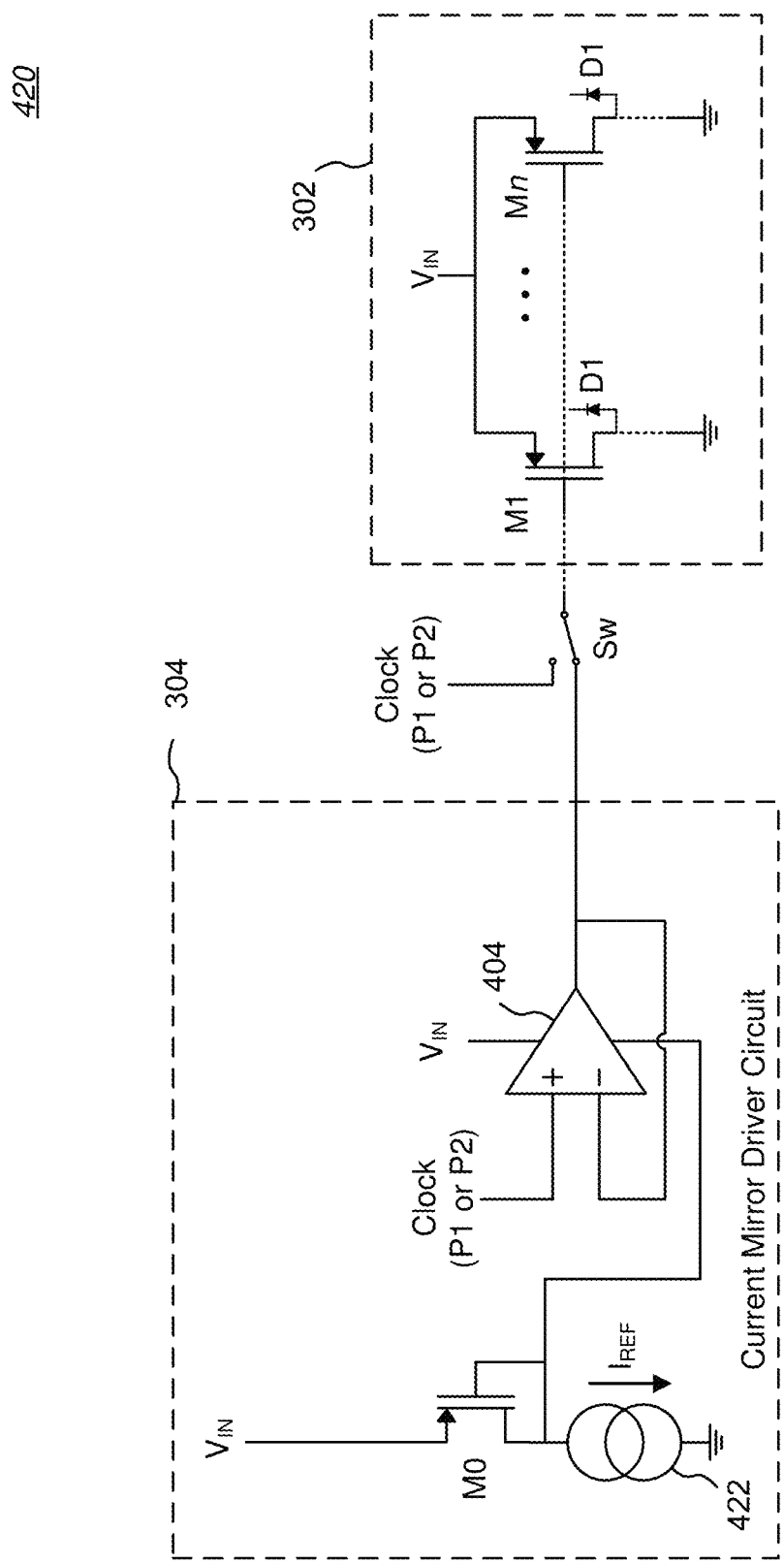
FIG. 4B is a schematic diagram of a current mirror comprising a VLOFET and a PFET embodiment of a current mirror driver circuit.

The current mirror driver circuit 304 of FIG. 4A is implemented in N-type FET circuitry. The current mirror driver circuit 304 may also be implemented in P-type FET circuitry. For example, FIG. 4B is a schematic diagram of a PFET embodiment of a current mirror 420 comprising a PFET VLOFET 302 and a PFET current mirror driver circuit 304. The illustrated circuit is essentially the P-type FET dual of the N-type FET circuit shown in FIG. 4A, taking into account the necessary reversals in polarity of some connections and components, including coupling the source of FET M0 to $V_{IN}$ and the drain and gate of FET M0 to a current source 422, through which flows a reference current $I_{REF}$. The diode voltage is applied to the nominal circuit ground terminal of the amplifier 404, and $V_{IN}$ is applied to the voltage supply input of the amplifier 404.

As in the example of FIG. 4A, while the SPDT switch Sw is shown as external to the current mirror driver circuit 304, it may be included as part of the current mirror driver circuit 304. For example, the switch SW may be positioned at the nominal circuit ground terminal of the amplifier 404 to switch between the diode voltage or a switching voltage that fully turns on the PMOS devices in the VLOFET 302. An alternative would be to tri-state (i.e., set to high impedance) the output of the amplifier 404 and drive FETs M1-Mn with a buffer that was tri-stated when the amplifier 404 was in use during the startup current in-rush period.

Second Embodiment of a Current Mirror Driver Circuit

Figure 5:
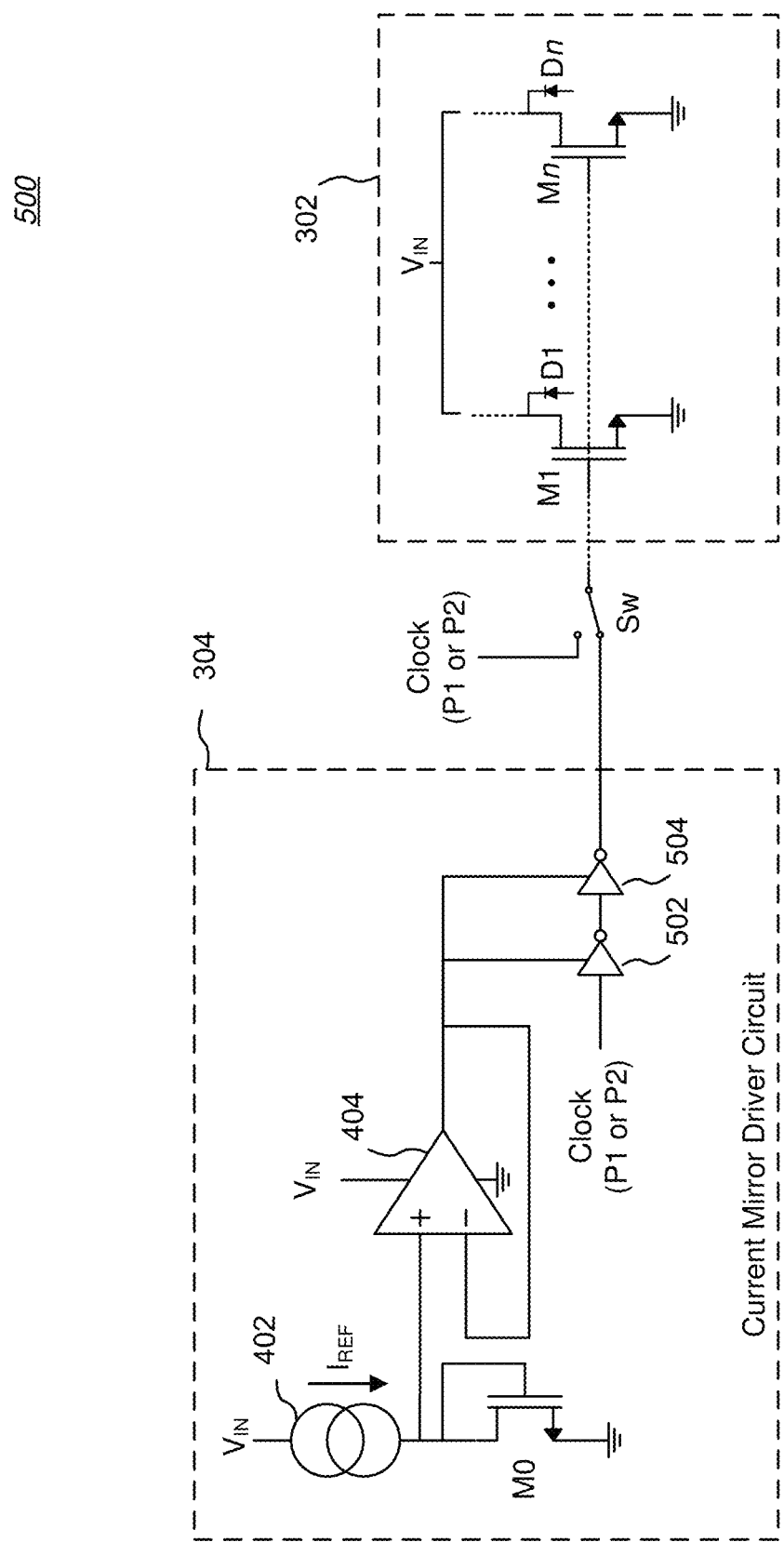
FIG. 5 is a schematic diagram of a current mirror comprising a VLOFET and a second embodiment of a current mirror driver circuit.

FIG. 5 is a schematic diagram of a current mirror 500 comprising a VLOFET 302 and a second embodiment of a current mirror driver circuit 304. In this NMOS embodiment, the gate of the FET M0 is coupled to the non-inverting input of a differential amplifier 404 configured as a voltage follower, while the voltage supply to the amplifier 404 is $V_{IN}$. The amplifier 404 is used to buffer the diode voltage across FET M0, since the output voltage of the amplifier 404 will track the diode voltage applied to the non-inverting ("+") input terminal. The output of the amplifier 404 is also coupled to the voltage supply input of first and second series-connected gate drive inverters 502, 504 (the circuit ground connection of the inverters 502, 504 is not shown).

The first gate drive inverter 502 has an input coupled to a clock (P1 or P2) matching the clock phase normally provided to the VLOFET 302. As one of ordinary skill in the art would understand, a PMOS embodiment can be similarly configured, taking into account the necessary reversals in polarity of some connections and components.

In the illustrated example, a SPDT switch Sw allows the gates of the FETs M1-Mn of the VLOFET 302 to be coupled either to the output of the second gate drive inverter 504 or to the clock phase normally provided to the VLOFET 302. As with the embodiments shown in FIGS. 4A and 4B, the current mirror driver circuit 304 outputs a pulsed voltage that ranges from 0V to the diode voltage of the M0 FET. As a consequence, the VLOFET 302 is current limited, mirroring the reference current $I_{REF}$ through the M0 FET. After operational equilibrium is achieved, the SPDT switch Sw switches to the clock input (e.g., P1 or P2) for normal control of the FETs M1-Mn. As in the examples of FIGS. 4A and 4B, while the SPDT switch Sw is shown as external to the current mirror driver circuit 304, it may be included as part of the current mirror driver circuit 304. For example, the switch SW may be positioned at the non-inverting ("+") input terminal of the amplifier 404 to switch between $V_{IN}$ or the diode voltage. Alternately, the switch Sw may be connected to the supply of the inverters, switching them between the diode voltage or $V_{IN}$.

Third Embodiment of a Current Mirror Driver Circuit

Figure 6:
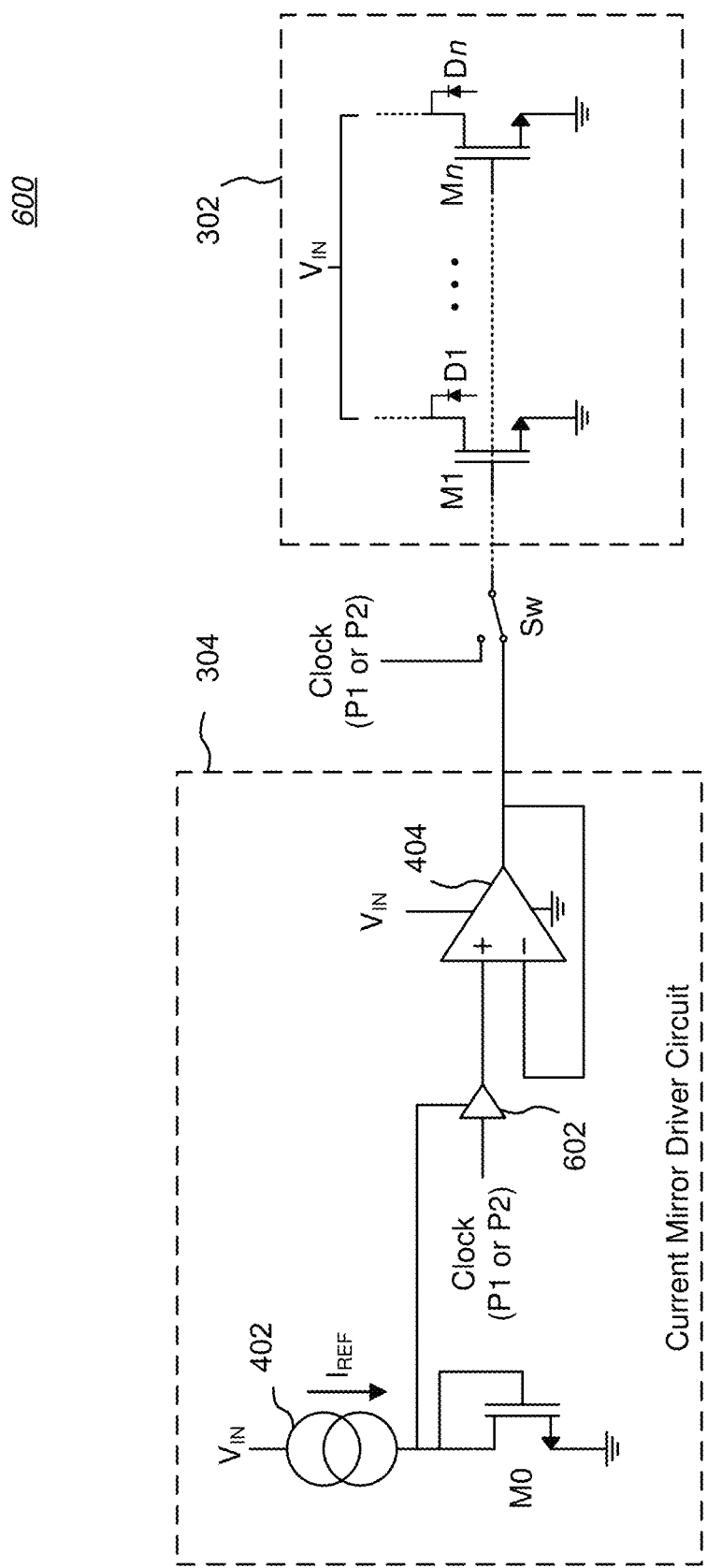
FIG. 6 is a schematic diagram of a current mirror comprising a VLOFET and a third embodiment of a current mirror driver circuit.

FIG. 6 is a schematic diagram of a current mirror 600 comprising a VLOFET 302 and a third embodiment of a current mirror driver circuit 304. In this embodiment, the gate of the FET M0 is coupled to the voltage supply input of a buffer 602 (e.g., a small logic buffer), the input to which is a clock (P1 or P2) matching the clock phase normally provided to the VLOFET 302. The output of the buffer 602 is coupled to the non-inverting ("+") input terminal of a differential amplifier 404 configured as a voltage follower and having a voltage supply of $V_{IN}$. The buffer 602 is used to level-shift the clock voltage (which is from about $V_{IN}$ to 0V) to range from the diode voltage to 0V. The amplifier 404 is used to further buffer the buffer 602 output, and thus the output voltage of the amplifier 404 will track the voltage applied to the non-inverting ("+") input terminal, ranging from the diode voltage to 0V. As one of ordinary skill in the art would understand, a PMOS embodiment can be similarly configured, taking into account the necessary reversals in polarity of some connections and components.

In the illustrated example, a SPDT switch Sw allows the gates of the FETs M1-Mn of the VLOFET 302 to be coupled either to the output of the amplifier 404 or to the clock phase normally provided to the VLOFET 302. As with the embodiments above, the current mirror driver circuit 304 outputs a pulsed voltage that ranges from 0V to the diode voltage of the M0 FET, and thus the VLOFET 302 is current limited, mirroring the reference current $I_{REF}$ through the M0 FET. Again, after operational equilibrium is achieved, the SPDT switch Sw switches to the clock input (e.g., P1 or P2) for normal control of the FETs M1-Mn. As in the examples of FIGS. 4A, 4B, and 5, while the SPDT switch Sw is shown as external to the current mirror driver circuit 304, it may be included as part of the current mirror driver circuit 304. For example, the switch SW may be positioned at the voltage supply input of the buffer 602 between the diode voltage or $V_{IN}$.

Fourth Embodiment of a Current Mirror Driver Circuit

The SPDT switch Sw of the embodiments shown in FIGS. 4A, 4B, 5, and 6 allows the current mirror driver circuit 304 to be switched out of circuit after operational equilibrium is achieved, thus essentially eliminating any influence the current mirror driver circuit 304 might have on normal operation of a converter that utilizes one or more of the VLOFETs 302. However, as noted above, in alternative embodiments the current mirror driver circuit 304 circuit itself may be reconfigured to apply the appropriate clock phase (e.g., P1 or P2) to the FETs M1-Mn of the VLOFET 302 for normal control of the FETs M1-Mn after operational equilibrium is achieved.

Figure 7:
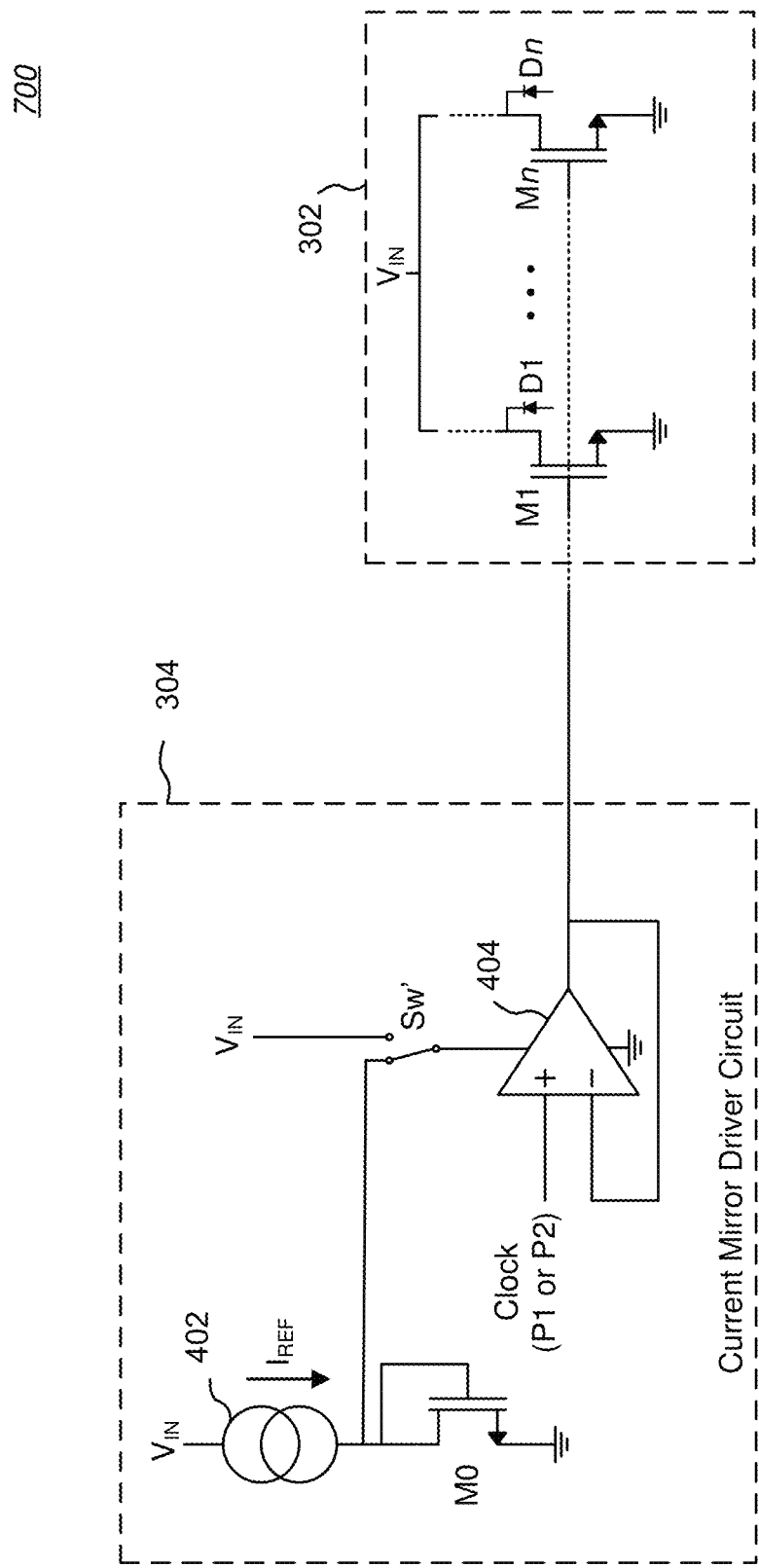
FIG. 7 is a schematic diagram of a current mirror comprising a VLOFET and a fourth embodiment of a current mirror driver circuit.

For example, FIG. 7 is a schematic diagram of a current mirror 700 comprising a VLOFET 302 and a fourth embodiment of a current mirror driver circuit 304. The illustrated current mirror driver circuit 304 is essentially the circuit shown in FIG. 4A, except that an SPDT reconfiguration switch Sw' allows the voltage input of the amplifier 404 to be coupled either to the gate of FET M0 (i.e., the diode voltage) or to $V_{IN}$. During a startup period, the gate of the FET M0 is coupled to the voltage supply input of the amplifier 404 through the reconfiguration switch Sw', and the VLOFET 302 is current limited as described above with respect to the current mirror driver circuit 304 shown in FIG. 4A. After operational equilibrium is achieved, $V_{IN}$ is coupled to the voltage supply input of the amplifier 404 through the reconfiguration switch Sw'. Since the voltage of the clock input (e.g., P1 or P2) is essentially $V_{IN}$ and the amplifier 404 is configured as a voltage follower, the clock input is essentially passed through the current mirror driver circuit 304 to the control gate of the VLOFET 302. Thus, the output of the amplifier 404 will alternate between 0V and the clock input voltage pulse and provide normal control of the FETs M1-Mn of the VLOFET 302.

Accordingly, the reconfiguration switch Sw' essentially enables two modes of operation for the current mirror driver circuit 304: a current limiting mode in which the current mirror driver circuit 304 limits current in the VLOFET 302, and a pass-through mode in which the current mirror driver circuit 304 passes through the clock (e.g., P1 or P2) to the control gate of the VLOFET 302. A period of time may be set for operation in the current limiting mode, for example, as a function of time alone, or until converter circuit operational equilibrium is achieved, or until the in-rush current is measured by a detection circuit to be below a specified level, or by any other suitable criteria. Further, the current-limiting mode may be enabled for non-startup purposes, such as when current through the VLOFET 302, as measured by a detection circuit, exceeds a specified level.

As should be appreciated, the current mirror driver circuits 304 of FIGS. 4B, 5, and 6 also may be adapted to include a similar reconfiguration switch Sw' to allow a current limiting mode in which the current mirror driver circuit 304 limits current in the VLOFET 302, and a pass-through mode in which the current mirror driver circuit 304 passes through the clock (e.g., P1 or P2) to the control gate of the VLOFET 302.

Methods

Another aspect of the invention includes methods for limiting current through a VLOFET, and methods for limiting current through a step-up DC-to-DC converter circuit having at least one VLOFET. For example, FIG. 8 is a process flow diagram 800 of a first method for limiting current through a VLOFET. The VLOFET includes a control gate configured to be coupled to or couplable to a source of a clock phase. The method includes coupling a current mirror driver circuit to the control gate of the VLOFET and to the source of the clock phase (Block 802), and selectively applying to the control gate of the VLOFET either the clock phase limited to a first voltage range by the current mirror driver circuit, or the clock phase limited to a second, wider voltage range, wherein the current mirror driver circuit and VLOFET, when coupled, comprise a current mirror that limits current flow through the VLOFET when the clock phase is limited to the first voltage range (Block 804).

As another example, FIG. 9 is a process flow diagram 900 of a first method for limiting in-rush current through a step-up DC-to-DC converter circuit having at least one VLOFET. The VLOFET includes a control gate configured to be coupled to or couplable to an associated source of a clock phase and connected in a circuit pathway that is subjected to startup in-rush current. The method includes coupling the control gate of at least one VLOFET to a corresponding current mirror driver circuit configured to be coupled to a general circuit supply voltage and to the associated source of the clock phase (Block 902); and coupling the current mirror driver circuit to a switch configured to selectively apply to the control gate of the at least one VLOFET either the clock phase limited to a first voltage range by the current mirror driver circuit, or the clock phase limited to a second, wider voltage range, wherein the at least one VLOFET and the corresponding current mirror driver circuit, when coupled, comprise a current mirror that limits in-rush current flow through the at least one VLOFET when the clock phase is limited to the first voltage range (Block 904).

The above methods may also include one or more of the following: wherein the corresponding current mirror driver circuit outputs a pulsed voltage to the control gate of the at least one VLOFET; further including applying the clock phase limited to a first voltage range during a period of time, and applying the clock phase limited to a second, wider voltage range after the period of time; wherein the corresponding current mirror driver circuit is reconfigurable to enable a current limiting mode of operation in which the corresponding current mirror driver circuit limits current flow in the at least one VLOFET, and a pass-through mode in which the associated clock phase passes through to the control gate of the at least one VLOFET; wherein the current mirror driver circuit corresponding to the at least one VLOFET includes a diode-connected field effect transistor (FET) coupled to a reference current and having a gate, and a differential amplifier having an output coupled to or couplable to the control gate of the at least one VLOFET, a non-inverting input coupled to the source of the associated clock phase, an inverting input coupled to the output, and one of a voltage supply input or ground terminal coupled to the gate of the diode-connected FET; wherein the current mirror driver circuit corresponding to the at least one VLOFET includes a diode-connected field effect transistor (FET) coupled to a reference current and having a gate, a differential amplifier having an output, a non-inverting input coupled to the gate of the diode-connected FET, an inverting input coupled to the output, and a voltage supply input coupled to the general circuit supply voltage, a first gate drive inverter having an input coupled to the source of the associated clock phase, a voltage supply input coupled to the output of the amplifier, and an output, and a second gate drive inverter having an input coupled to the output of the first gate drive inverter, a voltage supply input coupled to the output of the amplifier, and an output coupled to or couplable to the control gate of the at least one VLOFET; wherein the current mirror driver circuit corresponding to the at least one VLOFET includes a diode-connected field effect transistor (FET) coupled to a reference current and having a gate, a buffer having an input coupled to the source of the associated clock phase, a voltage supply input coupled to the gate of the diode-connected FET, and an output, and a differential amplifier having an output coupled to or couplable to the control gate of the at least one VLOFET, a non-inverting input coupled to the output of the buffer, an inverting input coupled to the output, and a voltage supply input coupled to the general circuit supply voltage; wherein the step-up DC-to-DC converter circuit is capacitor-based charge pump; wherein the step-up DC-to-DC converter circuit is a Dickson step-up DC-to-DC converter circuit; wherein the step-up DC-to-DC converter circuit is a Dickson step-up DC-to-DC converter circuit having a boost factor of 3; wherein the current mirror driver circuit is implemented in one of N-type FET circuitry or P-type FET circuitry; wherein the current mirror driver circuit is implemented in FET circuitry, and the FETs operate in a saturation region when in a current limiting mode and in a triode region when not in the current limiting mode; and/or wherein the current mirror limits in-rush current flowing through a respective body diode of the at least one VLOFET.

Benefits, Fabrication Technologies & Options

By using a current mirror driver circuit in conjunction with VLOFETs in circuit pathways that are subjected to startup in-rush current, in-rush current can be regulated to an acceptable level with minimal extra circuitry, thus enabling high efficiency (e.g., 95%-98%) step-up DC-to-DC converter circuits not otherwise possible using conventional in-rush current limiting techniques.

Another benefit of the current mirror circuits of some embodiments of the present invention is that such circuits are essentially not susceptible to process-voltage-temperature (PVT) variations, since the current limitation characteristics of the current mirror are a function of the ratio of the size of the reference FET M0 of the current mirror driver circuit 304 and the FETs M1-Mn of the VLOFET 302, and the ratio remains the same across PVT variations.

Another benefit of combining a current mirror driver circuit 304 with a VLOFET 302 in a current mirror configuration is that a circuit designer is given total control of in-rush current time by selecting circuit parameters of the current mirror driver circuit 304. A certain amount of charge is required to get a step-up DC-to-DC converter circuit 100 to its operational state (i.e., equilibrium). Current is simply the rate of charge flow. A conventional step-up DC-to-DC converter circuit 100 design using VLOFET's would dump the required charge uncontrollably over a short amount of time, leading to the problems noted above. A step-up DC-to-DC converter circuit 100 that includes a combination of a current mirror driver circuit 304 and VLOFETs 302 controls the charge flow over a longer time. The latter case provides a known charge time and a limited, controlled, current; the former case provides neither of these. Such control may be useful, for example, as a safety check, and safety is paramount in all power circuit designs. For example, DC-to-DC converter circuits will typically include a timer and monitor circuit that checks to see if the output voltage is where it should be at the end of a certain time period (e.g., at more than 95% of target value within X microseconds); if not, remedial action may be taken (e.g., powering down the circuit). In a conventional step-up DC-to-DC converter circuit 100 design, PVT variations have to be accounted for, and accordingly the time period will need to be long enough to cover unit-to-unit variations, resulting in longer start-up times. Such a case could be dangerous if a circuit exhibits quick power up times but requires a long time period, as errors are not detected until the end of the time period. Embodiments of the present invention are not susceptible to PVT variations and allow an accurate start up time to be known, thus reducing potential dangers by shortening the measurement time period of the timer and monitor circuit.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). The various FET's in embodiments of the invention, when enabled, may operate in their saturation region (where the FETs behave like voltage-controlled current sources) in the current limiting mode and in their triode region (where the FETs behave like voltage-controlled resistors) when not in the current limiting mode (i.e., when switching between ON and OFF in response to the applied clock phase). Component voltage, current, and power handling capabilities may be adapted as needed, for example, by adjusting device sizes, serially "stacking" components (particularly FETs) to withstand greater voltages, and/or using multiple components in parallel to handle greater currents or to lower resistance. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A circuit including a very low ohmic FET (VLOFET) having a control gate, and a current mirror driver circuit coupled to the control gate of the VLOFET, wherein the circuit is configured to have a current mirror mode in which current through the VLOFET is limited by the current mirror driver circuit during a startup period of time.

2. The invention of claim 1, wherein the circuit is further configured to have a pass-through mode of operation in which current through the VLOFET is not limited by the current mirror driver circuit after the startup period of time.

3. The invention of claim 1, wherein in the current mirror mode, the current mirror driver circuit and the VLOFET comprise a current mirror.

4. The invention of claim 3, wherein the current mirror limits current flow through the VLOFET as a result of the current mirror driver circuit limiting application of a clock phase to the control gate of the VLOFET to a first voltage range during the startup period of time.

5. The invention of claim 4, wherein the circuit is further configured to have a pass-through mode of operation in which the clock phase has a second, wider voltage range after the startup period of time.

6. A circuit including a very low ohmic FET (VLOFET) having a control gate, and a current mirror driver circuit coupled to the control gate of the VLOFET and configured to be coupled to a clock phase, wherein the circuit is configured to have a current mirror mode in which the clock phase, when coupled, is limited by the current mirror driver circuit.

7. The invention of claim 6, wherein the circuit is further configured to have a pass-through mode of operation in which the clock phase, when coupled, is not limited by the current mirror driver circuit.

8. The invention of claim 6, wherein in the current mirror mode, the current mirror driver circuit and the VLOFET comprise a current mirror.

9. The invention of claim 8, wherein the current mirror limits current flow through the VLOFET as a result of the current mirror driver circuit limiting the clock phase, when coupled, to a first voltage range for a selected period of time.

10. The invention of claim 9, wherein the circuit is further configured to have a pass-through mode of operation in which the clock phase, when coupled, has a second, wider voltage range after the selected period of time.

11. A circuit for limiting current through a very low ohmic FET (VLOFET) having a control gate, the circuit including a current mirror driver circuit configured to be coupled to the control gate of the VLOFET and to a clock phase, wherein the current mirror driver circuit and VLOFET, when coupled, comprise a current mirror that limits current flow through the VLOFET by limiting the clock phase to a first voltage range for a selected period of time.

12. The invention of claim 11, wherein the current mirror driver circuit outputs a pulsed voltage to the control gate of the VLOFET.

13. The invention of claim 11, wherein the current mirror limits in-rush current flowing through a respective body diode of the VLOFET.

14. The invention of claim 11, wherein the circuit is reconfigurable to enable a current-limiting mode of operation in which the current mirror driver circuit limits current flow in the coupled VLOFET, or to enable a pass-through mode in which the clock phase passes through to the control gate of the coupled VLOFET.

15. The invention of claim 11, further including a source of the clock phase.

16. The invention of claim 11, further including a switch coupled to the current mirror driver circuit and configured to selectively apply to the control gate of the VLOFET, when coupled, either the clock phase limited to a first voltage range by the current mirror driver circuit, or the clock phase limited to a second, wider voltage range.

17. The invention of claim 16, wherein the switch is configured to apply the clock phase limited to the first voltage range for a period of time, and apply the clock phase limited to the second, wider voltage range after the period of time.

18. The invention of claim 16, wherein the circuit is reconfigurable to enable a current-limiting mode of operation in which the current mirror driver circuit limits current flow in the coupled VLOFET, or to enable a pass-through mode in which the clock phase passes through to the control gate of the coupled VLOFET.

19. The invention of claim 16, wherein the current mirror driver circuit outputs a pulsed voltage to the control gate of the VLOFET.

20. The invention of claim 16, wherein the current mirror limits in-rush current flowing through a respective body diode of the VLOFET.

* * * * *